United States Patent
Whitney et al.

(10) Patent No.: US 11,456,597 B2
(45) Date of Patent: Sep. 27, 2022

(54) INPUT PROTECTION AND LEVEL SHIFTER CIRCUIT

(71) Applicants: David L. Whitney, Saratoga, CA (US); Manuel M. Del Arroz, Diablo, CA (US)

(72) Inventors: David L. Whitney, Saratoga, CA (US); Manuel M. Del Arroz, Diablo, CA (US)

(*) Notice: Subject to any disclaimer, the term of this patent is extended or adjusted under 35 U.S.C. 154(b) by 0 days.

(21) Appl. No.: 17/221,790

(22) Filed: Apr. 3, 2021

(65) Prior Publication Data

US 2021/0249855 A1 Aug. 12, 2021

Related U.S. Application Data

(63) Continuation-in-part of application No. 16/246,390, filed on Jan. 11, 2019, now abandoned.

(60) Provisional application No. 62/749,017, filed on Oct. 22, 2018.

(51) Int. Cl.
*H02H 9/02* (2006.01)
*H02H 9/04* (2006.01)
*H03K 19/0185* (2006.01)
*H02H 1/00* (2006.01)

(52) U.S. Cl.
CPC .......... *H02H 9/046* (2013.01); *H02H 1/0007* (2013.01); *H03K 19/018507* (2013.01)

(58) Field of Classification Search
CPC ................. H02H 1/0007; H02H 9/046; H03K 19/018507; H03K 19/20; H01L 27/0285; H01L 27/0605; H01L 28/20; H01L 29/20; H01L 27/0248; H01L 29/2003; H01L 29/205; H01L 29/7787
See application file for complete search history.

(56) References Cited

U.S. PATENT DOCUMENTS

| 2014/0268444 A1* | 9/2014 | Bertin ................. H01L 27/0266 977/938 |
| 2017/0243862 A1* | 8/2017 | Parthasarathy ..... H01L 29/7783 |
| 2019/0393693 A1* | 12/2019 | Shibib ................ H03K 17/6871 |

* cited by examiner

*Primary Examiner* — Gary L Laxton
(74) *Attorney, Agent, or Firm* — Douglas L. Weller

(57) ABSTRACT

Voltage clamping and level shifting is provided. A first reverse direction high-electron-mobility transistor includes a source connected to an input pad, and a drain connected to a first reference voltage. A second reverse direction high-electron-mobility transistor includes a source and a gate connected to a second reference voltage, and a drain connected to the input pad. A gate of the first reverse direction high-electron-mobility transistor is connected to the second reference voltage. Level shifting is provided by an arrangement of three high-electron-mobility transistor and a resistive element

13 Claims, 6 Drawing Sheets

INPUT PROTECTION AND LEVEL SHIFTER CIRCUIT

BACKGROUND

A metal-oxide-semiconductor field-effect transistor (MOSFET) uses an insulated gate to control current flow between a source and a drain of the MOSFET. Current Voltage characteristics of a conventional MOSFET are shown in FIG. 1. In FIG. 1, the horizontal axis represents voltage from the drain to the source (Vds). The vertical axis represents current values flow from the drain to the source (Ids). As long as the MOSFET is forward biased (Vds is positive), the gate-to-source voltage (Vgs)—sometimes called gate voltage Vg—controls current flow (Ids) through the MOSFET. The threshold voltage (Vth) is the minimum value of Vgs that is needed to create a conducting path between the source and the drain. As illustrated in FIG. 1, increasing the gate voltage above the threshold voltage results in increased conductivity.

When the MOSFET is negative biased (Vds is negative), the gate-to-source voltage (Vg) has less impact on current flow through the MOSFET. This is the result of a body diode intrinsic within FETs which allows current flow from source to drain regardless of the gate voltage. For example, in an n-channel MOSFET, the source and the drain are n+ regions and the body is a p region. The p-n junction formed at the intersection of the p body and the n+ regions act as a diode between the body and the source of the MOSFET and between the body and the drain of the MOSFET. Because in a MOSFET the source is typically shorted to the body, the body diode between the body and the source is irrelevant. However, the body diode to the drain allows a current path from the body to the drain when the MOSFET is negative biased (Vds is negative).

DETAILED DESCRIPTION

A high-electron-mobility transistor (HEMT) also known as a heterostructure FET (HFET) is a field-effect transistor incorporating a junction between two materials with different band gaps at the channel instead of a doped region. In a Gallium Arsenide (GaAs) HEMT, a depleted Aluminum Gallium Arsenide (AlGaAs) layer is placed over a non-doped narrow-bandgap channel layer of GaAs. The electrons generated in the thin n-type AlGaAs layer drop into the GaAs layer to form a depleted AlGaAs layer. The heterojunction created by different band-gap materials forms a quantum well in the conduction band on the GaAs side where the electrons can move quickly without colliding with any impurities. This creates a very thin layer of highly mobile conducting electrons with very high concentration, giving the channel very low resistivity. Other materials can be used to form a HEMT such as in a Gallium Nitride HEMT. GaN-based HEMTs have a similar layered structure where no intentional doping is required. In AlGaN/GaN HEMTs, electrons form a high carrier concentration at the interface, which leads to a two-dimensional electron gas (2DEG) channel due to the spontaneous polarization found in wurtzite-structured GaN. The 2DEG is a function of AlGaN thickness and the bound positive charge at the interface. AlGaN/GaN HEMTs providing high power density and breakdown voltage can be achieved. The polarization effect between the GaN channel layer and AlGaN barrier layer causes a sheet of uncompensated charge in the order of 0.01-0.03 Coulombs per meter (C/m) to form. If the 2DEG is continuous between source and drain the transistor will be normally on or depletion HEMT (dHEMT) turning off with a negative gate bias. With the addition of Mg doping or other techniques to compensate the built in charge under the gate, the 2DEG is not continuous at zero gate bias. This will achieve a normally off or enhancement mode behavior characteristic of an enhancement HEMT (eHEMT).

Additional eHEMT devices of interest are Indium Phosphate (InP) based HEMTs due to their high electron mobility, high electron saturation velocity, and high electron concentration. These devices are made of an InGaAs/InAlAs composite cap layer, an undoped InAlAs Schottky barrier and an InGaAs/InAs composite channel for superior electron transport properties.

Figure 1:
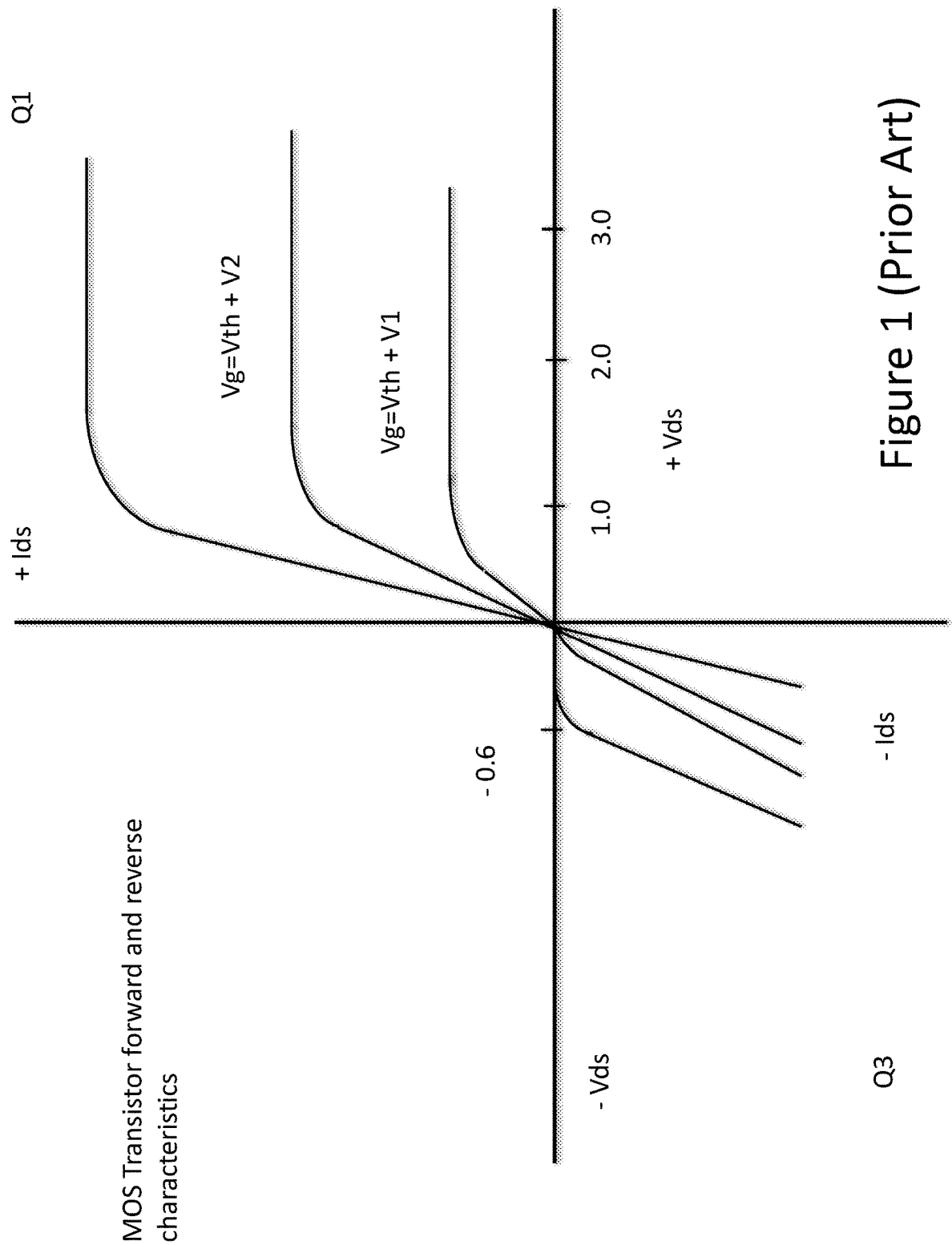
FIG. 1 shows current characteristics of a typical metal-oxide-semiconductor field-effect transistor (MOSFET) in accordance with the prior art.
Figure 2:
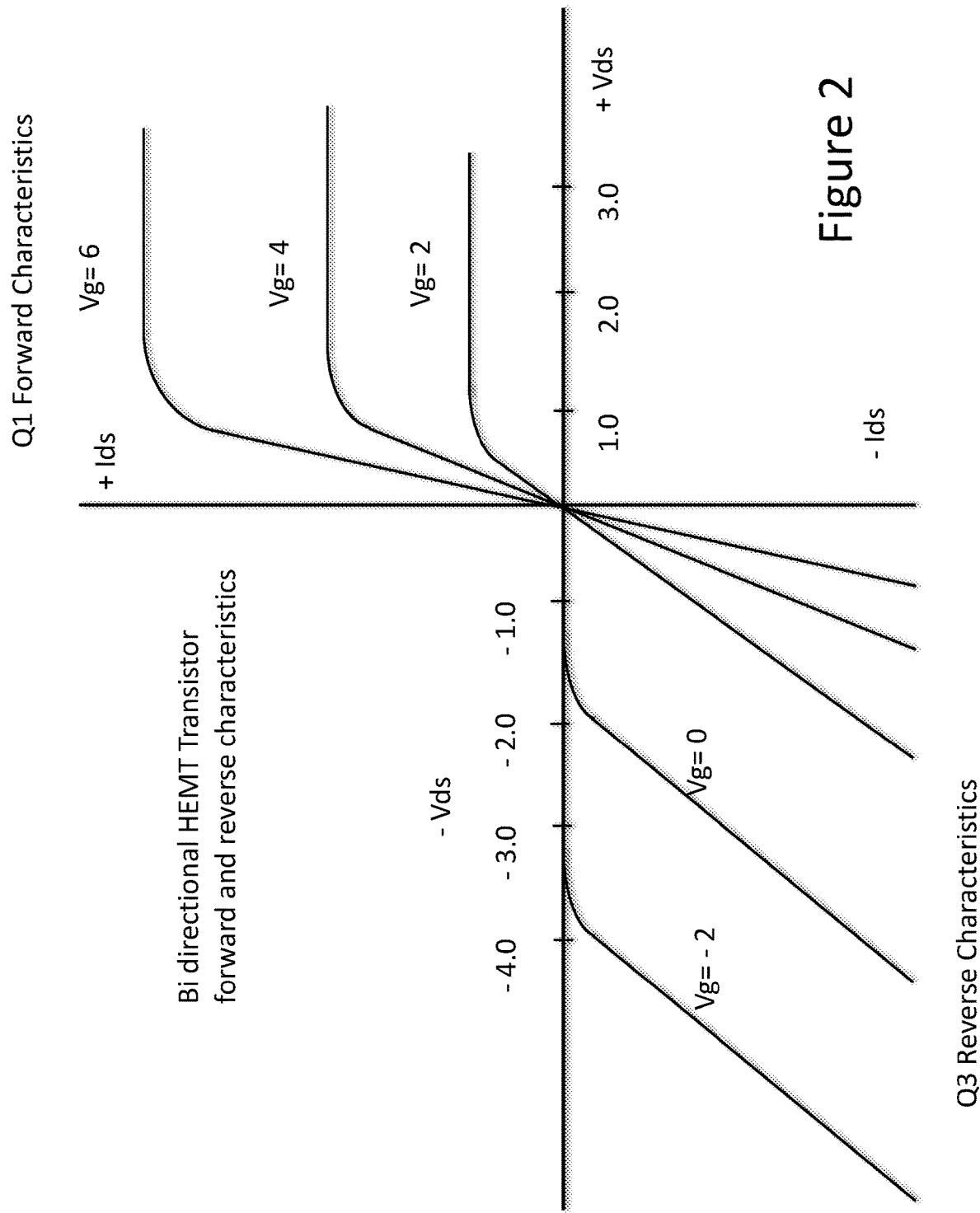
FIG. 2 shows current characteristics of a high-electron-mobility transistor (HEMT).

Since there are no p-n junction within an HEMT, there is no p-n body diode formed. This results in significantly different voltage characteristics between a HEMT and a MOSFET. For example, FIG. 2 shows current voltage characteristics of a HEMT. In FIG. 2, the horizontal axis represents voltage from the drain to the source (Vds). The vertical axis represents current values flow from the drain to the source (Ids). HEMT transistor current-voltage characteristics in the forward direction look similar to PN junction technologies like MOSFETs. That is, as long as the HEMT is forward biased (Vds is positive), the gate-to-source voltage (Vgs) controls current flow (Ids) through the HEMT.

The reverse conduction characteristics of a reverse direction HEMT (RDHEMT) are different than the reverse conduction characteristics of MOSFETS because in HEMTs there is no p-n body diode formed. In addition to the ability to block reverse voltages above the typical 0.6 volts of forward biased silicon PN junctions, some HEMT transistors turn on in the reverse direction with a negative voltage on the drain relative to the source (−Vds) primarily due to charge injection into the enhancement mode channel. This category of HEMT transistors have reverse conduction characteristics that differ from their forward conduction characteristics in both cause and form.

For example, Gallium nitride HEMTs are an example of HEMT transistors that have a reverse conduction mode and have attracted attention due to their high-power and high frequency performance. In the reverse direction, such an RDHEMT device starts to conduct when the absolute value of the negative drain voltage with respect to the source voltage |−Vds| is greater than the gate threshold voltage. The RDHEMT then exhibits a channel resistance and conducts current. If a negative gate voltage is applied with respect to the source voltage, the negative drain to source voltage must be increased for the RDHEMT to conduct current.

Figure 3:
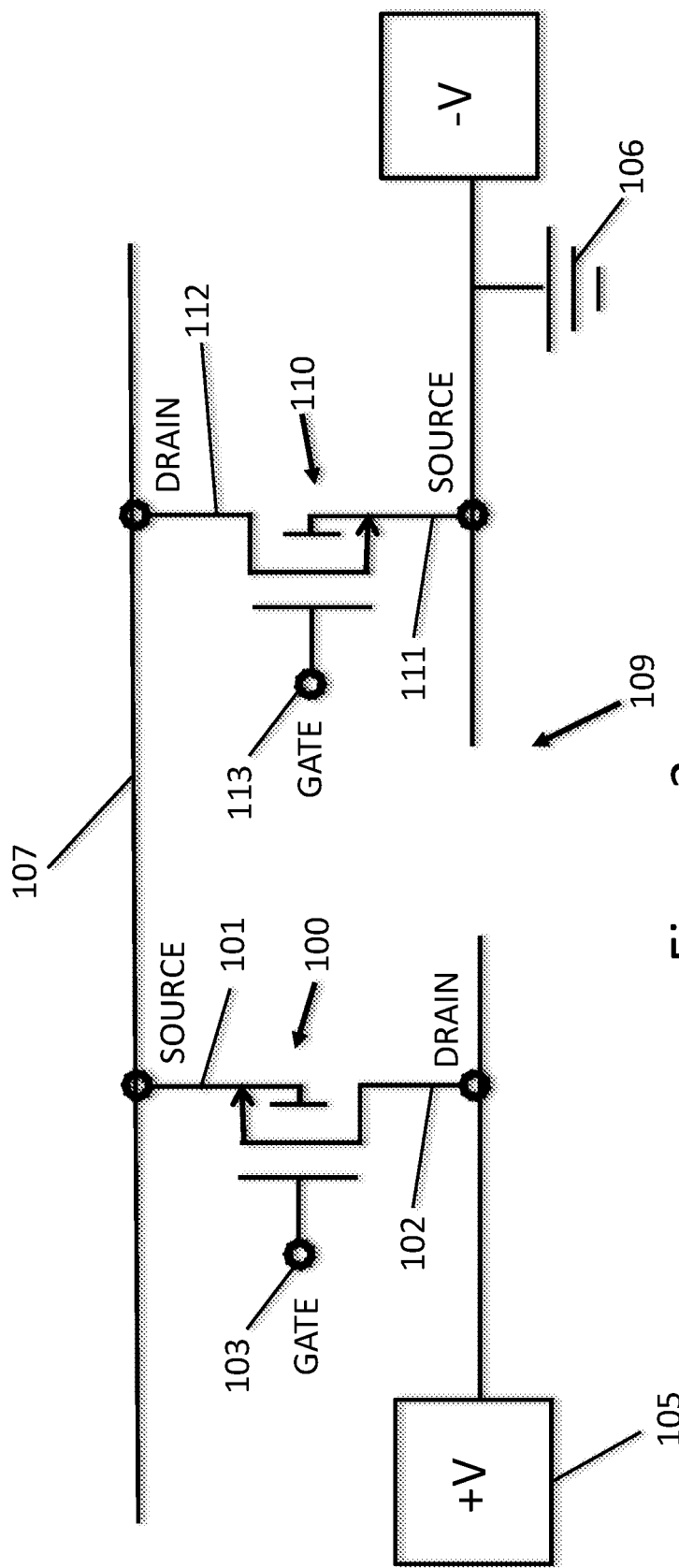
FIG. 3 is a simplified circuit diagram of an input protection circuit.

FIG. 3 is a simplified circuit diagram of an input protection circuit 109 used to clamp voltage excursions by using RDHEMT operation in the reverse direction.

An RDHEMT 100 has a source 101, a drain 102 and a gate 103. An RDHEMT 110 has a source 111, a drain 112 and a gate 113. Source 111 and gate 113 of RDHEMT 110 are connected to a reference voltage 106 (−V). Drain 102 of RDHEMT 100 is connected to a reference voltage 105 (+V). Source 101 and gate 103 of RDHEMT 100 and drain 112 of RDHEMT 110 are all connected to a line 107 that is voltage clamped.

Because source 101 and gate 103 of RDHEMT 100 are connected to line 107, line 107 is voltage clamped from being significantly more positive than reference voltage reference voltage +V. When the voltage on line 107 is increased to be much greater than reference voltage +V, the drain to source voltage or Vds of RDHEMT 100 will decrease and go negative. As the voltage on line 107 continues to increase, the magnitude of the negative drain to source voltage of RDHEMT 100 will continue to increase until RDHEMT 100 begins to conduct current in the reverse direction from line 107 through to reference voltage 105 (+V), resulting in a voltage clamping effect on line 107.

The operating characteristics of RDHEMT 100 are illustrated in FIG. 2 as seen for the case where Vgs=0. When Vgs=0 and Vds is greater than −1.6 volts, there is no current flow through RDHEMT 100. When Vgs=0 and Vds is less than −1.6 volts, there is a reverse current flow through RDHEMT 100. This current flow at the voltage threshold of −1.6 volts is what allows RDHEMT 100 to clamp the voltage on line 107 beginning where the voltage on line 107 is 1.6 volts more than V+.

Because drain 112 of RDHEMT 110 is connected to line 107, line 107 is voltage clamped from being significantly more negative than reference voltage −V from reference voltage 106. When the voltage on line 107 is decreased to be much less than reference voltage −V, the drain to source voltage or Vds of RDHEMT 110 will decrease and go negative. As the voltage on line 107 continues to decrease, the magnitude of the negative drain to source voltage of RDHEMT 110 will continue to increase until RDHEMT 110 begins to conduct current in the reverse direction from line 107 to reference voltage 106, resulting in a voltage clamping effect on line 107.

The operating characteristics of RDHEMT 110 are also illustrated in FIG. 2 for the case where Vgs=0. When Vgs=0 and Vds is greater than −1.6 volts, there is no current flow through RDHEMT 110. When Vgs=0 and Vds is less than −1.6 volts, there is a reverse current flow through RDHEMT 110. This current flow at the voltage threshold of −1.6 volts is what allows RDHEMT 110 to clamp the voltage on line 107 beginning where the voltage on line 107 is 1.6 volts less than reference voltage −V. For RDHEMT 110, therefore, the voltage threshold of −1.6 volts is referred to herein as the reverse conduction onset voltage, or as the clamping voltage. The voltage at gate 103 and the voltage at gate 113 can be varied to modify the clamping voltage for RDHEMT 110. In general, the clamping voltage will be at the reverse conduction onset voltage.

Figure 4:
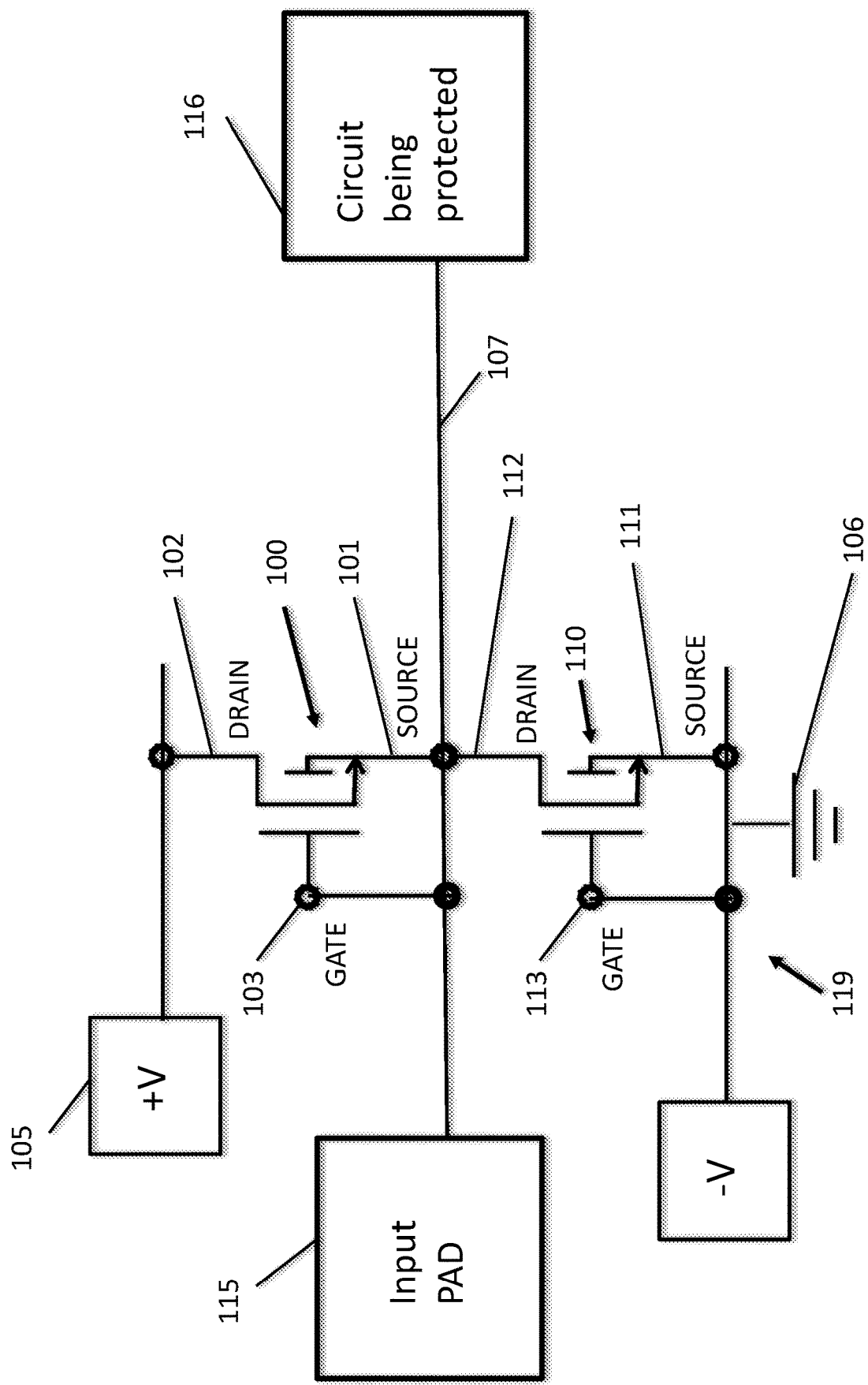
FIG. 4 is a simplified circuit diagram showing an input protection circuit providing electrostatic discharge protection for an input pad of an integrated circuit.

FIG. 4 shows input protection circuit 119 used for electrostatic discharge (ESD) protection on an input pad 115 of an integrated circuit 116. When voltage on input pad 115 experiences an ESD or over voltage event, the voltage on input pad 115 can go positive or negative relative to the Gnd (−V) or reference voltage +V. Input protection circuit 119 assures that the voltage does not go too far above reference voltage +V or too far below GND. As discussed above, beginning where the voltage on input pad 115 (and thus line 107) is 1.6 volts more than V+, there is a reverse current flow through RDHEMT 100. This current flow at the reverse conduction onset voltage of −1.6 volts is what allows RDHEMT 100 to clamp the voltage on input pad 115 beginning where the voltage on input pad 115 is 1.6 volts more than V+. Likewise, beginning where the voltage on input pad 115 is 1.6 volts less than V1 (Gnd), there is a reverse current flow through RDHEMT 110. This current flow at the reverse conduction onset voltage of −1.6 volts is what allows RDHEMT 110 to clamp the voltage on input pad 115 beginning where the voltage on input pad 115 is 1.6 volts less than V−.

Figure 5:
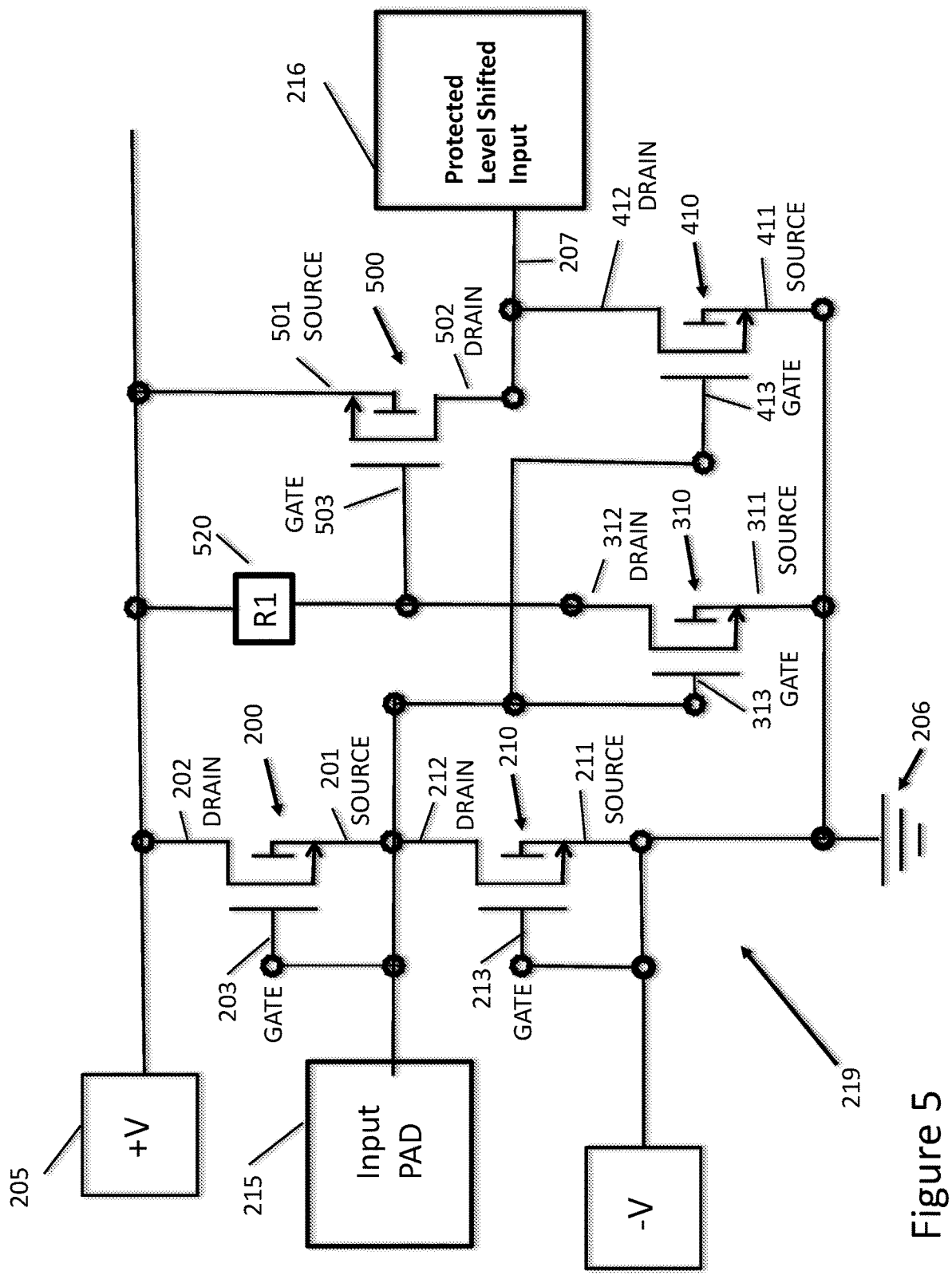
FIG. 5 is a simplified circuit diagram showing an input protection and level shifter circuit providing electrostatic discharge protection for an input pad of an integrated circuit.

FIG. 5 shows an input protection and level shifter circuit 219 used for electrostatic discharge (ESD) protection on an input pad 215 of an integrated circuit and for level shifting to produce a protected level shifted circuit input 216. Input protection and level shifter circuit 219 uses RDHEMT operation.

An RDHEMT 200 and an RDHEMT 210 are used to clamp voltage excursions by using RDHEMT operation in the reverse direction. RDHEMT 200 has a source 201, a drain 202 and a gate 203. RDHEMT 210 has a source 211, a drain 212 and a gate 213.

An HEMT 310, an HEMT 410, and RDHEMT 500 and a first end of a resistive element 520 are used for level shifting. HEMT 310 has a source 311, a drain 312 and a gate 313. HEMT 410 has a source 411, a drain 412 and a gate 413. RDHEMT 500 has a source 501, a drain 502 and a gate 503.

Source 211 and gate 213 of RDHEMT 210, source 311 of HEMT 310 and source 411 of HEMT 410 are all connected to a reference voltage 206 (−V). Drain 202 of RDHEMT 200, source 501 of RDHEMT 500 and a resistive element 520 connected to a reference voltage 205 (+V). Drain 502 of RDHEMT 500 and Drain 412 of HEMT 410 are connected to line 207. Source 201 and gate 203 of RDHEMT 200, drain 212 of RDHEMT 210, gate 313 of HEMT 310 and gate 413 of HEMT 410 are all connected to input pad 215, that is voltage clamped.

Because source 201 and gate 203 of RDHEMT 200 are connected to Input Pad 215, Input Pad 215 is voltage clamped from being significantly more positive than reference voltage reference voltage +V. When the voltage on Input Pad 215 is increased to be much greater than reference voltage +V, the drain to source voltage or Vds of RDHEMT 200 will decrease and go negative. As the voltage on Input Pad 215 continues to increase, the magnitude of the negative drain to source voltage of RDHEMT 200 will continue to increase until RDHEMT 200 begins to conduct current in the reverse direction from Input Pad 215 through to reference voltage 205 (+V), resulting in a voltage clamping effect on Input Pad 215.

For example, where −V=0, the operating characteristics of RDHEMT 200 are illustrated in FIG. 2 as seen for the case where Vgs=0. When Vgs=0 and Vds is greater than −1.6 volts, there is no current flow through RDHEMT 200. When Vgs=0 and Vds is less than −1.6 volts, there is a reverse current flow through RDHEMT 200. This current flow at the voltage threshold of −1.6 volts is what allows RDHEMT 200 to clamp the voltage on Input Pad 215 beginning where the voltage on Input Pad 215 is 1.6 volts more than V+.

Because drain 212 of RDHEMT 210 is connected to Input Pad 215, Input Pad 215 is voltage clamped from being significantly more negative than reference voltage −V from reference voltage 206. When the voltage on Input Pad 215 is decreased to be much less than reference voltage −V, the drain to source voltage or Vds of RDHEMT 210 will decrease and go negative. As the voltage on Input Pad 215 continues to decrease, the magnitude of the negative drain to source voltage of RDHEMT 210 will continue to increase until RDHEMT 210 begins to conduct current in the reverse direction from Input Pad 215 to reference voltage 206, resulting in a voltage clamping effect on Input Pad 215.

The operating characteristics of RDHEMT 210 are illustrated in FIG. 2 for the case where Vgs=0. When Vgs=0 and Vds is greater than −1.6 volts, there is no current flow through RDHEMT 210. When Vgs=0 and Vds is less than −1.6 volts, there is a reverse current flow through RDHEMT 210. This current flow at the voltage threshold of −1.6 volts is what allows RDHEMT 210 to clamp the voltage on Input Pad 215 beginning where the voltage on Input Pad 215 is 1.6 volts less than reference voltage −V. For RDHEMT 210, therefore, the voltage threshold of −1.6 volts is referred to herein as the reverse conduction onset voltage, or as the clamping voltage. The voltage at gate 203 and the voltage at gate 213 can be varied to modify the clamping voltage for RDHEMT 210. In general, the clamping voltage will be at the reverse conduction onset voltage.

When voltage on input pad 215 experiences an ESD or over voltage event, the voltage on input pad 215 can go positive or negative relative to the Gnd (−V) or reference voltage +V. Input protection and level shifter circuit 219 assures that the voltage does not go too far above reference voltage +V or too far below GND.

Drain 312 of HEMT 310 and Gate 503 of RDHEMT 500 are connected to a second end of resistive element 520. Drain 502 of RDHEMT 500, drain 412 of HEMT 411 and protected level shifted circuit input 216 are connected together at a line 207 to provide level shifting of the clamped voltage at Input Pad 215 at protected level shifted circuit input 216.

Figure 6:
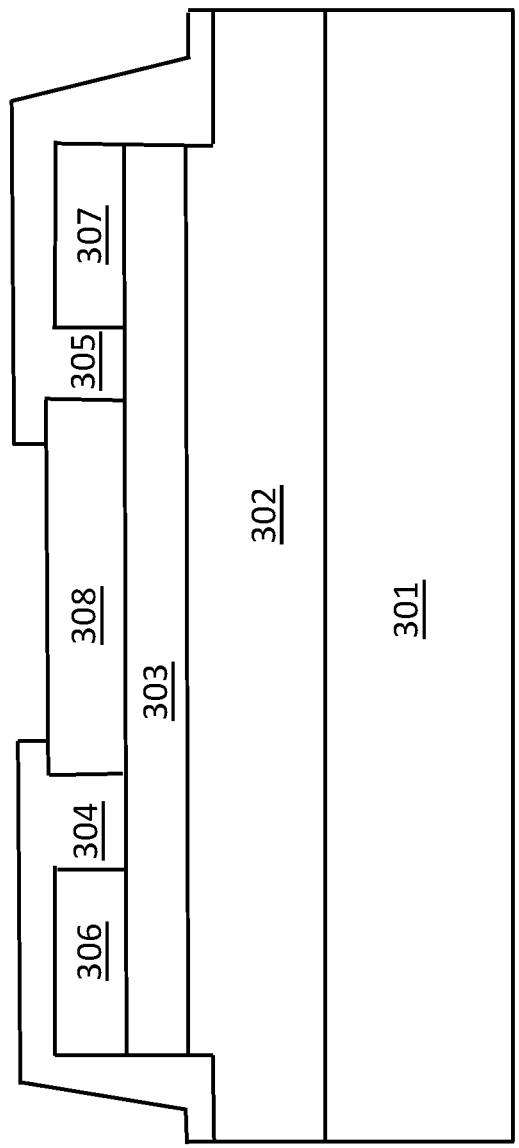
FIG. 6 shows an example schematic for a Gallium nitride high-electron-mobility transistor.

FIG. 6 shows an example schematic for a Gallium nitride high-electron-mobility transistor where a non-doped narrow-bandgap channel layer of Gallium Nitride (GaN) 302 is formed on Sapphire substrate 301. An Aluminum Gallium Nitride (AlGaN) region 303 is formed over non-doped narrow-bandgap channel layer 302. A source 306 is formed of, for example, Silicon, Titanium, Nickel, Aluminum, Gold or some other suitable material. A drain 307 is also formed of, for example, Silicon, Titanium, Nickel, Aluminum, Gold or some other suitable material. A gate 308 is formed of, for example, Nickel, Gold or some other suitable material. A polyimide region 304 may be formed around source 306 and a polyimide region 305 may be formed around drain 307.

The foregoing discussion discloses and describes merely exemplary methods and embodiments. As will be understood by those familiar with the art, the disclosed subject matter may be embodied in other specific forms without departing from the spirit or characteristics thereof. Accordingly, the present disclosure is intended to be illustrative, but not limiting, of the scope of the invention, which is set forth in the following claims.

What is claimed is:

1. An input protection and level shifter circuit, comprising:
   a first reference voltage;
   a second reference voltage;
   an input pad;
   a protected level shifted circuit input;
   a first reverse direction high-electron-mobility transistor, the first reverse direction high-electron-mobility transistor including:
      a first source connected to the input pad,
      a first gate connected to the input pad, and
      a first drain connected to the first reference voltage; and,
   a second reverse direction high-electron-mobility transistor, the second reverse direction high-electron-mobility transistor including:
      a second source connected to the second reference voltage,
      a second gate connected to the second reference voltage, and
      a second drain connected to the input pad;
   a third reverse high-electron-mobility transistor, the first high-electron-mobility transistor including:
      a third source connected to the first reference voltage;
      a third gate, and
      a third drain connected to the protected level shifted circuit input,
   a first high-electron-mobility transistor, the first high-electron-mobility transistor including:
      a fourth source connected to the second reference voltage,
      a fourth gate connected to the input pad, and
      a fourth drain connected to the third gate of the third reverse high-electron-mobility transistor;
   a second high-electron-mobility transistor, the second high-electron-mobility transistor including:
      a fifth source connected to the second reference voltage,
      a fifth gate connected to input pad, and
      a fifth drain connected to the protected level shifted circuit input; and
   a resistive element connected between the first reference voltage and the fourth drain of the first high-electron-mobility transistor.

2. The input protection and level shifter circuit as in claim 1, wherein the first reverse direction high-electron-mobility transistor is a Gallium nitride high-electron-mobility transistor where an Aluminum Gallium Nitride (AlGaN) region is formed over a non-doped narrow-bandgap channel layer of Gallium Nitride (GaN).

3. The input protection and level shifter circuit as in claim 2, wherein the second reverse direction high-electron-mobility transistor is a Gallium nitride high-electron-mobility transistor where an Aluminum Gallium Nitride (AlGaN) region is formed over a non-doped narrow-bandgap channel layer of Gallium Nitride (GaN).

4. The input protection and level shifter circuit as in claim 1, wherein the input protection and level shifter circuit provides electrostatic discharge protection to an integrated circuit.

5. An electrostatic discharge protection circuit, comprising:
   a first reference voltage;
   a second reference voltage;
   an input pad to an integrated circuit;
   a first reverse direction high-electron-mobility transistor, the first reverse direction high-electron-mobility transistor including:
      a first source connected to the input pad,
      a first gate connected to the input pad, and
      a first drain connected to the first reference voltage; and,
   a second reverse direction high-electron-mobility transistor, the second reverse direction high-electron-mobility transistor including:
      a second source connected to the second reference voltage, a second gate connected to the second reference voltage, and
a second drain connected to the input pad;
a third reverse high-electron-mobility transistor, the first high-electron-mobility transistor including:
a third source connected to the first reference voltage;
a third gate, and
a third drain connected to the protected level shifted circuit input,
a first high-electron-mobility transistor, the first high-electron-mobility transistor including:
a fourth source connected to the second reference voltage,
a fourth gate connected to the input pad, and
a fourth drain connected to the third gate of the third reverse high- electron-mobility transistor;
a second high-electron-mobility transistor, the second high-electron-mobility transistor including:
a fifth source connected to the second reference voltage,
a fifth gate connected to input pad, and
a fifth drain connected to the protected level shifted circuit input; and
a resistive element connected between the first reference voltage and the fourth drain of the first high-electron-mobility transistor.

6. The electrostatic discharge protection circuit as in claim 5, wherein the first reverse direction high-electron-mobility transistor is a Gallium nitride high-electron-mobility transistor where an Aluminum Gallium Nitride (AlGaN) region is formed over a non-doped narrow-bandgap channel layer of Gallium Nitride (GaN).

7. The electrostatic discharge protection circuit as in claim 6, wherein the second reverse direction high-electron-mobility transistor is a Gallium nitride high-electron-mobility transistor where an Aluminum Gallium Nitride (AlGaN) region is formed over a non-doped narrow-bandgap channel layer of Gallium Nitride (GaN).

8. The electrostatic discharge protection circuit as in claim 5, wherein the input protection and level shifter circuit provides electrostatic discharge protection to an integrated circuit.

9. A method for clamping and level shifting a voltage on an input pad to produce a protected level shifted circuit input, comprising:
providing a first reference voltage;
providing a second reference voltage;
connecting a first source and a first gate of a first reverse direction high-electron- mobility transistor to the input pad;
connecting a first drain of the first reverse direction high-electron-mobility transistor to the first reference voltage;
connecting a second source and a second gate of a second reverse direction high-electron-mobility transistor to the second reference voltage;
connecting a second drain of the second reverse direction high-electron-mobility transistor to the input pad;
connecting a third source of a third reverse direction high-electron-mobility transistor to the first reference voltage;
connecting a third drain of the third reverse direction high-electron-mobility transistor to the protected level shifted circuit input;
connecting a fourth source of a first high-electron-mobility transistor to the second reference voltage;
connecting a fourth gate of the first high-electron-mobility transistor to the input pad;
connecting a fourth drain of the first high-electron-mobility transistor to a third gate of the third reverse direction high-electron-mobility transistor;
connecting a fifth source of a second high-electron-mobility transistor to the second reference voltage;
connecting a fifth gate of the second high-electron-mobility transistor to the input pad;
connecting a fifth drain of the second high-electron-mobility transistor to the protected level shifted circuit input; and
connecting a resistive element between the first reference voltage and the fourth drain of the first high-electron-mobility transistor.

10. The method as in claim 9, wherein the first reverse direction high-electron-mobility transistor is a Gallium nitride high-electron-mobility transistor where an Aluminum Gallium Nitride (AlGaN) region is formed over a non-doped narrow-bandgap channel layer of Gallium Nitride (GaN).

11. The method as in claim 10, wherein the second reverse direction high-electron-mobility transistor is a Gallium nitride high-electron-mobility transistor where an Aluminum Gallium Nitride (AlGaN) region is formed over a non-doped narrow-bandgap channel layer of Gallium Nitride (GaN).

12. The method as in claim 9, wherein the clamped voltage provides electrostatic discharge protection to an integrated circuit.

13. The method as in claim 9, wherein the clamped voltage provides electrostatic discharge protection to the input pad.

* * * * *